United States Patent
Yu

(10) Patent No.: US 10,826,017 B2
(45) Date of Patent: Nov. 3, 2020

(54) PACKAGING ASSEMBLY AND PREPARATION METHOD THEREOF, AND DISPLAY DEVICE

(71) Applicant: Shenzhen China Star Optoelectronics Semiconductor Display Technology Co., Ltd., Shenzhen, Guangdong (CN)

(72) Inventor: Ming-Jiue Yu, Guangdong (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 0 days.

(21) Appl. No.: 16/108,577

(22) Filed: Aug. 22, 2018

(65) Prior Publication Data
US 2019/0302499 A1    Oct. 3, 2019

Related U.S. Application Data

(63) Continuation of application No. PCT/CN2018/087857, filed on May 22, 2018.

(30) Foreign Application Priority Data

Mar. 30, 2018    (CN) .......................... 2018 1 0294123

(51) Int. Cl.
*H01L 51/52*    (2006.01)
*G02F 1/1345*    (2006.01)
*G02F 1/1333*    (2006.01)

(52) U.S. Cl.
CPC ........ *H01L 51/5256* (2013.01); *G02F 1/1345* (2013.01); *G02F 1/133305* (2013.01);
(Continued)

(58) Field of Classification Search
CPC ............. H01L 51/5256; H01L 51/0097; H01L 2251/5338; H01L 31/03926; C03C 17/42; G09G 2330/04; G09G 2380/02
See application file for complete search history.

(56) References Cited

U.S. PATENT DOCUMENTS 9,240,567 B2 *  1/2016  Park .................... H01L 51/5256
2008/0176041 A1 *  7/2008  Sato .................... H01L 51/0097
                                                              428/161
(Continued)

FOREIGN PATENT DOCUMENTS

CN    101577317 A    11/2009
CN    203165953 U    8/2013
(Continued)

OTHER PUBLICATIONS

Third Office Action of counterpart Chinese patent Application No. 201810294123.9 dated Nov. 28, 2019.

*Primary Examiner* — Scott B Geyer

(57) ABSTRACT

The present disclosure provides a packaging assembly and a preparation method thereof, and a display device. The packaging assembly may include at least one of packaging unit; the at least one of packaging unit including a first inorganic layer, a second inorganic layer, and an organic layer sequentially stacked, wherein a material of the first inorganic layer and a material of the second inorganic layer are different. Holes inside the layers may be reduced, and a density of the layers may be increased. An effect of blocking the water vapor may be higher than that of a single layer, and a packaging effect may be better.

7 Claims, 4 Drawing Sheets

- S11: a flexible display device may be provided; a first inorganic layer may be deposited on a surface of the flexible display device
- S12: a second inorganic layer may be deposited on a surface of the first inorganic layer
- S13: an organic layer may be deposited on a surface of the second inorganic layer
- S14: a packaging unit may be formed, which may have the first inorganic layer, the second inorganic layer arranged on the first inorganic layer, and the organic layer arranged on the second inorganic layer that are sequentially stacked; at least two of the packaging units may be arranged to be stacked on the flexible display device

(52) U.S. Cl.
CPC .................. *G02F 1/133308* (2013.01); *G02F 2001/133311* (2013.01)

(56) References Cited

U.S. PATENT DOCUMENTS

| | | | | |
|---|---|---|---|---|
| 2010/0157585 A1* | 6/2010 | Diekmann | ............... | F21S 6/002 362/228 |
| 2011/0140164 A1* | 6/2011 | Seo | ..................... | H01L 51/5256 257/100 |
| 2011/0234477 A1* | 9/2011 | Sano | ................... | H01L 51/0097 345/77 |
| 2014/0049825 A1* | 2/2014 | van Mol | ............. | H01L 51/5259 359/513 |
| 2014/0061619 A1* | 3/2014 | Zhu | ..................... | H01L 51/5256 257/40 |
| 2014/0145979 A1* | 5/2014 | Lee | ..................... | H01L 51/5256 345/173 |
| 2014/0240614 A1* | 8/2014 | Ahn | ...................... | H01L 27/323 349/12 |
| 2014/0374704 A1* | 12/2014 | Jang | ................... | H01L 27/3248 257/40 |
| 2016/0111666 A1* | 4/2016 | Jung | ................... | H01L 51/0096 257/40 |
| 2016/0124557 A1 | 5/2016 | Choi | | |
| 2016/0322598 A1 | 11/2016 | Kim et al. | | |
| 2017/0012242 A1 | 1/2017 | Choi et al. | | |
| 2017/0155089 A1* | 6/2017 | Xie | ......................... | H01L 51/56 |
| 2017/0162823 A1* | 6/2017 | Kim | ......................... | B32B 9/041 |
| 2017/0278920 A1* | 9/2017 | Park | ...................... | H01L 27/3293 |
| 2018/0032189 A1* | 2/2018 | Lee | ...................... | G09G 3/3225 |
| 2018/0059485 A1* | 3/2018 | Nam | ................... | G02F 1/133617 |
| 2018/0122830 A1* | 5/2018 | Kachatryan | ........... | B32B 27/285 |
| 2018/0158880 A1* | 6/2018 | Kim | ...................... | H01L 27/3209 |
| 2018/0166652 A1* | 6/2018 | Kim | ......................... | B32B 15/20 |
| 2018/0203554 A1* | 7/2018 | Cho | ...................... | G06F 3/0412 |
| 2018/0215948 A1* | 8/2018 | Kim | ...................... | C09D 183/06 |
| 2018/0308903 A1* | 10/2018 | Jeong | ................... | H01L 27/323 |

FOREIGN PATENT DOCUMENTS

| | | |
|---|---|---|
| CN | 105575998 A | 5/2016 |
| CN | 106299153 A | 1/2017 |
| CN | 107123753 A | 9/2017 |
| CN | 107359266 A | 11/2017 |

\* cited by examiner

10

20

30

40

50

US 10,826,017 B2

PACKAGING ASSEMBLY AND PREPARATION METHOD THEREOF, AND DISPLAY DEVICE

CROSS-REFERENCE TO RELATED APPLICATIONS

The present application is a continuation-application of International (PCT) Patent Application No. PCT/CN2018/087857, filed on May 22, 2018, which claims foreign priority of Chinese Patent Application No. 201810294123.9, filed on Mar. 30, 2018 in the State Intellectual Property Office of China, the entire contents of which are hereby incorporated by reference.

FIELD

The described embodiments relate to a technology of display, and more particularly, to a packaging assembly and a preparation method thereof, and a display device.

BACKGROUND

In order to protect a flexible display device, a packaging layer is generally formed on a surface of the flexible display device to block water vapor penetration and prevent device degradation. If the packaging layer is composed only of inorganic materials, it is easily broken due to an excessive stress. Therefore, it usually uses an inorganic layer and a photoresist layer which are stacked to form the packaging layer. Holes in the single inorganic layer are easily generated, and sizes of the holes tend to increase as a thickness of the layer increases, so that a density of the layer decreases.

SUMMARY

The present disclosure provides a packaging assembly and a preparation method thereof, and a display device. For a flexible display device in the related art, technical problems of a low density of an inorganic layer for packaging may be solved.

In order to solve the above-mentioned technical problem, a technical solution adopted by the present disclosure is to provide a packaging assembly comprising at least one of packaging unit; the at least one of packaging unit comprising a first inorganic layer, a second inorganic layer arranged on the first inorganic layer, and an organic layer arranged on the second inorganic layer that are sequentially stacked, wherein a material of the first inorganic layer and a material of the second inorganic layer are different.

In order to solve the above-mentioned technical problem, another technical solution adopted by the present disclosure is to provide a display device comprising: a flexible display device and a packaging assembly; the package assembly being attached to a surface of the flexible display device; wherein the package assembly comprises at least one of packaging unit; the at least one of packaging unit comprises a first inorganic layer, a second inorganic layer arranged on the first inorganic layer, and an organic layer arranged on the second inorganic layer that are sequentially stacked; wherein a material of the first inorganic layer and a material of the second inorganic layer are different.

In order to solve the above-mentioned technical problem, further another technical solution adopted by the present disclosure is to provide a preparation method for a packaging assembly, comprising: providing a flexible display device; depositing a first inorganic layer on a surface of the flexible display device by an atomic layer deposition method; depositing a second inorganic layer on a surface of the first inorganic layer by the atomic layer deposition method; depositing an organic layer on a surface of the second inorganic layer by a chemical vapor deposition method; wherein a material of the first inorganic layer and a material of the second inorganic layer are different.

Advantages of the disclosure may follow. As compared with the related art, the present disclosure may provide a packaging assembly comprising at least one of packaging unit; the at least one of packaging unit comprising a first inorganic layer, a second inorganic layer arranged on the first inorganic layer, and an organic layer arranged on the second inorganic layer that are sequentially stacked, wherein a material of the first inorganic layer and a material of the second inorganic layer are different. Because different inorganic materials have different characteristics, holes may be not easily generated between the first inorganic layer and the second inorganic layer, so as to reduce the internal holes of layers. A thickness of each inorganic layer may be reduced, so that it may be not easy to increase sizes of the holes, thereby a density of the layer may be increased, to block the water vapor effectively, and to improve a packaging effect.

DETAILED DESCRIPTION

The detailed description set forth below is intended as a description of the subject technology with reference to the appended figures and embodiments. It is understood that the embodiments described herein include merely some parts of the embodiments of the present disclosure, but do not include all the embodiments. Based on the embodiments of the present disclosure, all other embodiments that those skilled in the art may derive from these embodiments are within the scope of the present disclosure.

Figure 1:
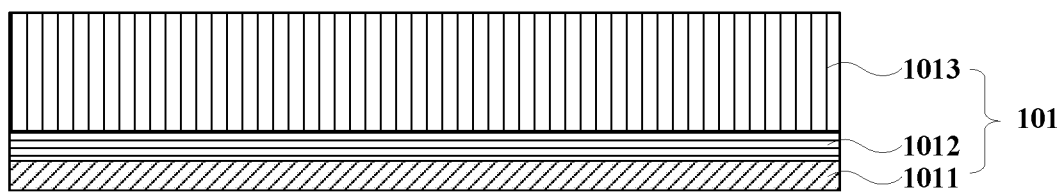
FIG. 1 is a structural illustration of a packaging assembly in accordance with an embodiment in the present disclosure.

As shown in FIG. 1, a packaging assembly 10 provided by the present disclosure may comprise at least one of packaging unit 101; the at least one of packaging unit 101 may comprise a first inorganic layer 1011, a second inorganic layer 1012 arranged on the inorganic layer 1011, and an organic layer 1013 arranged on the second inorganic layer 1012 that are sequentially stacked.

A material of the first inorganic layer 1011 and a material of the second inorganic layer 1012 may be different.

In an embodiment, as shown in FIG. 1, the packaging assembly 10 may comprise the packaging unit 101; the packaging unit 101 may comprise the first inorganic layer 1011, the second inorganic layer 1012 arranged on the inorganic layer 1011, and the organic layer 1013 arranged on the second inorganic layer 1012 that are sequentially stacked. Because the packaging assembly 10 may be layers configured to block the water vapor for the flexible display device, materials used for the first inorganic layer 1011 and the second inorganic layer 1012 may be different.

For example, the material of the first inorganic layer 1011 may be selected from the group consisting of metal oxide and a combination of metal oxide, such as one of aluminium oxide ($Al_2O_3$), hafnium dioxide ($HfO_2$), zirconium dioxide ($ZrO_2$), and tantalum pentoxide ($Ta_2O_5$), or a combination of the above. The material of the second inorganic layer 1012 may be selected from the group consisting of metal oxide and a combination of a metal oxide, which is different from the material of the first inorganic layer 1011. For example, when the first inorganic layer 1011 is made of $Al_2O_3$, the second inorganic layer 1012 may be made of $HfO_2$, or when the first inorganic layer 1011 is made of a combination of $Al_2O_3$ and $ZrO_2$, and the second inorganic layer 1012 may be made of a combination of $HfO_2$ and $Ta_2O_5$.

Methods of forming the first inorganic layer 1011 and the second inorganic layer 1012 may be the same. For example, both the layers may be formed by an atomic layer deposition (ALD) method. The methods of forming the first inorganic layer 1011 and the second inorganic layer 1012 may be different. For example, the first inorganic layer 1011 may be formed by the ALD method, and the second inorganic layer 1012 may be form by a chemical vapor deposition (CVD) method.

In the an embodiment, the organic layer 1013 may be formed by a same method of forming the first inorganic layer 1011 and/or the second inorganic layer 1012, or by a different method of that. The material of the organic layer 1013 may be selected according to actual requirements. For example, a photoresist or an organic material containing silicon oxycarbide (SiOC), such as an organic material composed of SiOC, may be selected.

Because a layer formed by the ALD method may be better than a layer formed by the CVD method in blocking the water vapor, and the layer formed by the CVD method is better than a photoresist in blocking the water vapor. The first inorganic layer 1011 and the second inorganic layer 1012 may be formed by the ALD method, and the organic layer 1013 may be formed by the CVD method.

In order to further enhance a effect of the blocking the water vapor, and to maintain a good bending resistance of the packaging assembly 10, the layer formed by the CVD method may be made of an organic material composed of SiOC. For example, a material of the organic layer may be an organic material comprising at least one of silicon oxycarbide (SiOC), silicon oxynitride (SiOCN), and silicon formaldehyde (SiOCH).

Compared a conventional single layer formed by the ALD method with the first inorganic layer 1011 and the second inorganic layer 1012 adapted in the an embodiment which may be two inorganic layers formed by the ALD method, because the materials of the two layers formed by the ALD method may be different and thickness of each layer formed by the ALD method may be small, so that a defect size (i.e., the sizes of the holes) inside the layers formed by the ALD method may be reduced, and the density of the layers formed by the ALD method may be increased. The effect of blocking the water vapor may be higher than that of a single layer formed by the ALD method, and the packaging effect may be better.

The thicknesses of the first inorganic layer 1011, the second inorganic layer 1012, and the organic layer 1013 may be determined according to actual requirements. The thicknesses of the first inorganic layer 1011 and/or the second inorganic layer 1012 may be in a range of about 10 to 100 nanometers, and the thickness of the organic layer 1013 may be in a range of about 100 to 1000 nanometers (e.g., 500 nanometers). The thicknesses of the first inorganic layer 1011 and the second inorganic layer 1012 may be the same or different. For example, the thickness of the first inorganic layer 1011 and the second inorganic layer 1012 may both be 50 nanometers, or the thickness of the first inorganic layer 1011 may be 20 nanometers, and the thickness of the second inorganic layer 1012 may be 90 nanometers.

In other embodiments, the packaging assembly may comprise two or more packaging units 101 according to packaging requirements of the flexible display device and size requirements of the display device. The structure of each packaging unit 101 may refer to the structure shown in FIG. 1.

Figure 2:
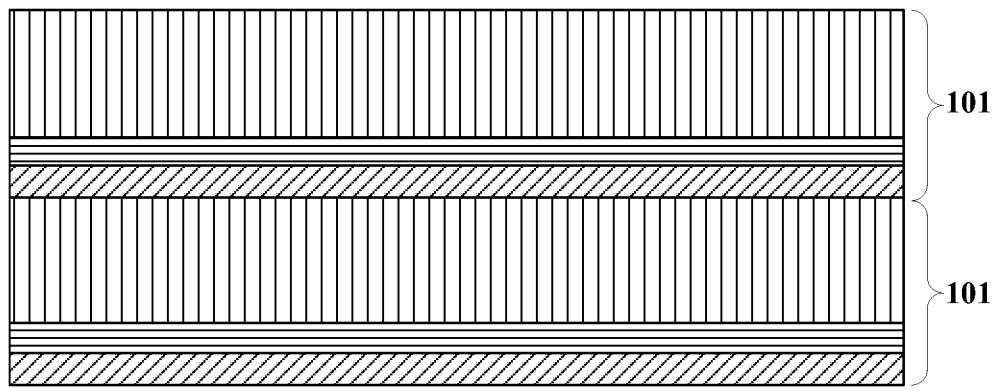
FIG. 2 is a structural illustration of a packaging assembly containing two packaging units in accordance with an embodiment in the present disclosure.
Figure 3:
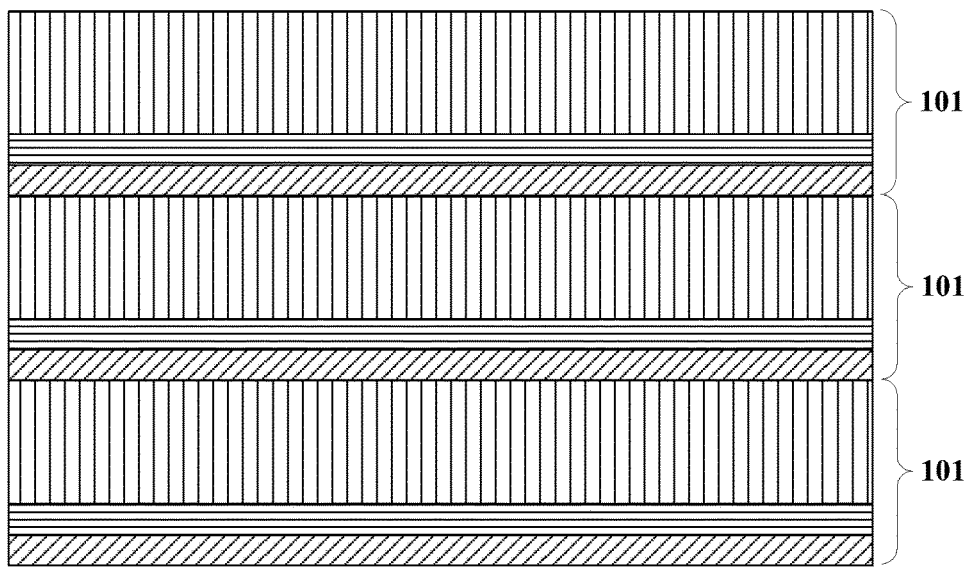
FIG. 3 is a structural illustration of a packaging assembly containing three packaging units in accordance with an embodiment in the present disclosure.

As shown in FIG. 2, the packaging assembly 20 may comprise two stacked packaging units 101, so as to form two inorganic layers, one organic layer, two inorganic layers, and one organic layer that are sequentially stacked. It may block the water vapor better, and may improve the packaging effect. Alternatively, as shown in FIG. 3, the packaging assembly 30 may comprise three stacked packaging units 101.

In other embodiments, three or more inorganic layers may also be provided in the packaging unit according to actual requirements. Materials of adjacent two inorganic layers may be different, and the organic layer may also adopt a structure of a multi-layer.

Figure 4:
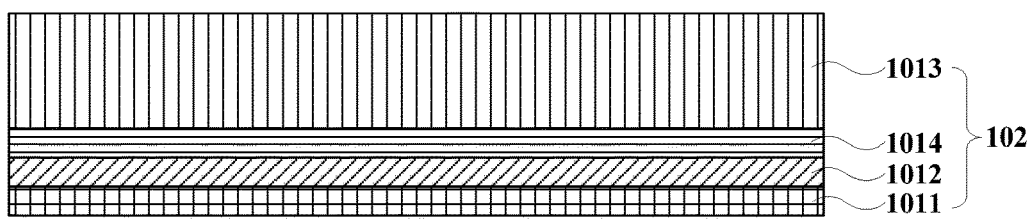
FIG. 4 is a structural illustration of a packaging assembly in accordance with another embodiment in the present disclosure.

As shown in FIG. 4, a structure of the packaging assembly 40 may be similar to that of the package assembly 10 in the above-mentioned embodiment, therefore no additional description for similarities is given herebelow. The difference between the packaging assembly 40 and the the packaging assembly 10 may be that a packaging unit 102 in the an embodiment may comprise the first inorganic layer 1011, the second inorganic layer 1012 arranged on the the first inorganic layer 1011, a third inorganic layer 1014 arranged on the the second inorganic layer 1012, and the organic layer 1013 arranged on the third inorganic layer 1014 that are sequentially stacked.

Materials of adjacent two of the first inorganic layer 1011, the second inorganic layer 1012, and the third inorganic layer 1014, may be different.

In an embodiment, the materials of the first inorganic layer 1011 and the third inorganic layer 1014 may a same material, e.g., the materials may be both $Al_2O_3$; and the material of the second inorganic layer 1012 may be different from that of the first inorganic layer 1011, i.e., the materials may be $ZrO_2$. In other embodiments, the materials of the first inorganic layer 1011, the second inorganic layer 1012, and the third inorganic layer 1014 may also be different from each other, and it is not specifically limited herebelow.

In the an embodiment, adjacent two inorganic layers may be made of different materials. It may reduce the defect size inside the layers, and may be better than the single layer in the effect of blocking the water vapor.

Figure 5:
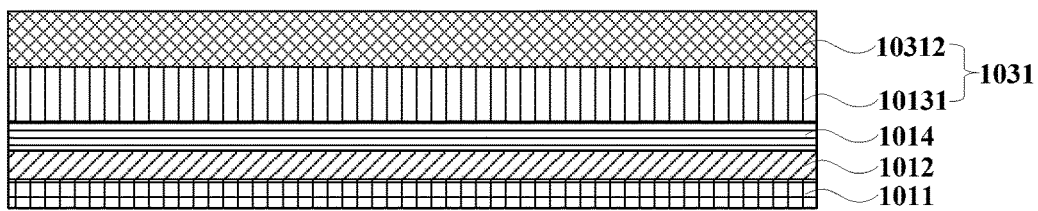
FIG. 5 is a structural illustration of an organic layer containing two layers of a packaging assembly in accordance with another embodiment in the present disclosure.

In other embodiments, the organic layer 1013 in the packaging unit may also be a multi-layer structure, such as the first organic layer 10131 and the second organic layer 10132 having two-layer structure shown in FIG. 5.

Figure 6:
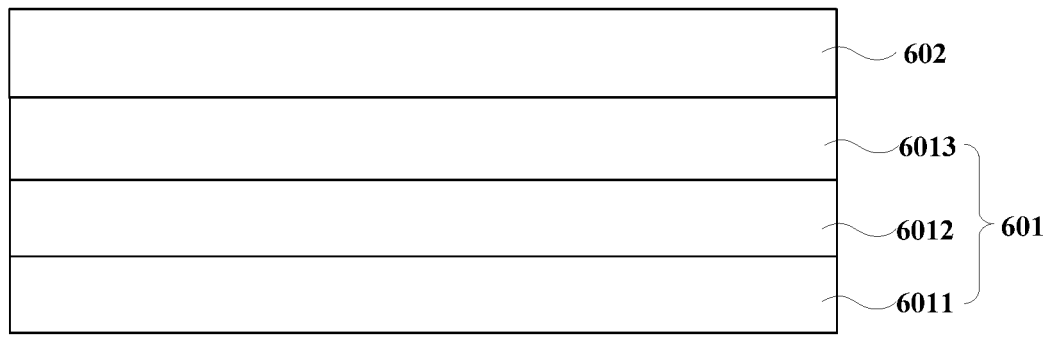
FIG. 6 is a structural illustration of a display device in accordance with an embodiment in the present disclosure.

As shown in FIG. 6, in the an embodiment, a display device 60 may comprise a flexible display device 601 and a package assembly 602.

The package assembly 602 may be attached to a surface of the flexible display device 601. It may enhance the effect of the blocking the water vapor into the flexible display device 601, and to maintain a good bending resistance of the packaging assembly. A specific structure of the package assembly 602 may be the structure of the package assembly in the above-mentioned embodiment, therefore no additional description is given herebelow.

In the embodiment, the flexible display device 601 may be a display device of a liquid crystal display (LCD), or a display device of an organic light emitting display (OLED), it is not specifically limited herebelow.

In an embodiment, as shown in FIG. 6, a flexible display device 601 may comprise a substrate 6011, a buffer layer 6012, and a display module 6013 that are sequentially stacked. The substrate 6011 may be a plastic substrate, a glass substrate, or the like. The buffer layer 6012 may be an organic buffer layer formed of an organic material. The display assembly 6013 may be a thin film transistor (TFT) and an OLED display panel, or may be a TFT and an LCD display panel.

The display assembly 6013 of the flexible display device 601 may be attached to the package assembly 602 away from a surface of the buffer layer 6012. A package assembly 602 may be a multi-layer structure directly arranged on the display assembly 6013, or the package assembly 602 may be a preperated multi-layer structure attached to a surface of the display module 6013 by means of viscose or the like.

Figure 7:
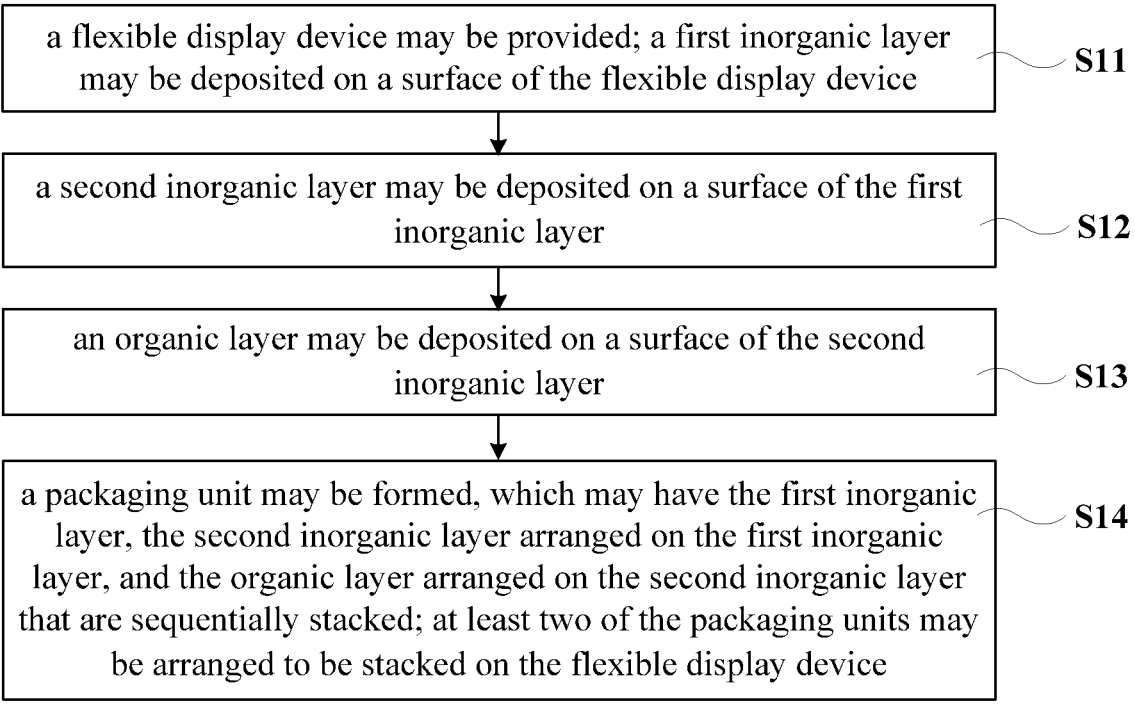
FIG. 7 is a flow chart of a packaging assembly in accordance with an embodiment in the present disclosure.

As shown in FIG. 7, FIG. 7 is a flow chart of a packaging assembly in accordance with an embodiment in the present disclosure, which may comprise:

S11: a flexible display device may be provided; a first inorganic layer may be deposited on a surface of the flexible display device.

S12: a second inorganic layer may be deposited on a surface of the first inorganic layer.

S13: an organic layer may be deposited on a surface of the second inorganic layer.

Materials of the first inorganic layer and the second inorganic layer may be different.

For example, the material of the first inorganic layer may be selected from the group consisting of metal oxide and a combination of metal oxide, such as one of $Al_2O_3$, $HfO_2$, $ZrO_2$, and $Ta_2O_5$, or a combination of the above. The material of the second inorganic layer may be selected from the group consisting of metal oxide and a combination of a metal oxide, which is different from the material of the first inorganic layer. For example, when the first inorganic layer is made of $Al_2O_3$, the second inorganic layer may be $HfO_2$, or when the first inorganic layer is a combination of $Al_2O_3$ and $ZrO_2$, and the second inorganic layer may be a combination of $HfO_2$ and $Ta_2O_5$. The organic layer may be made of an organic material composed of SiOC. For example, a material of the organic layer may be an organic material comprising at least one of SiOC, SiOCN, and SiOCH.

The thicknesses of the first inorganic layer and/or the second inorganic layer may be in a range of about 10 to 100 nanometers, and the thickness of the organic layer may be in a range of about 100 to 1000 nanometers.

Figure 8:
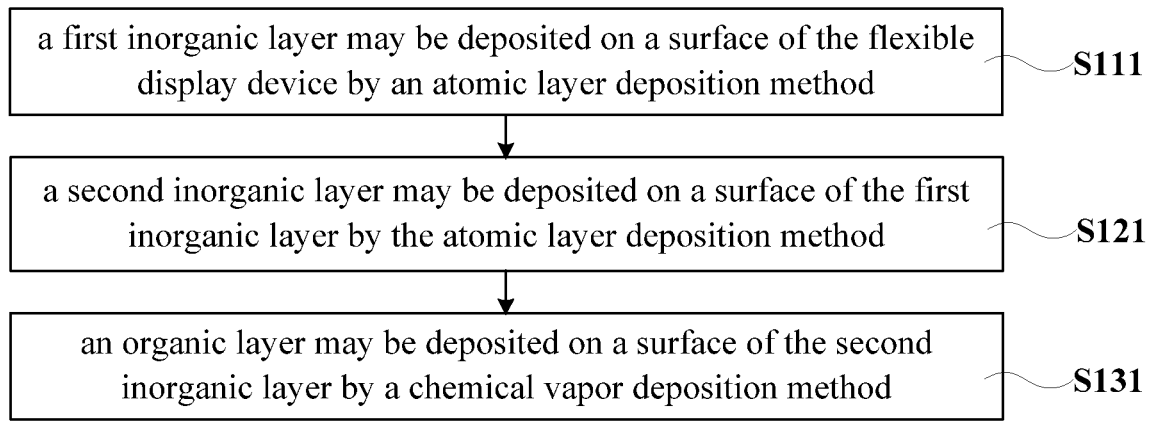
FIG. 8 is a specific flow chart of the blocks S11, S12, and S13 in FIG. 7.

As shown in FIG. 8, the block S11 may comprise:

S111: a first inorganic layer may be deposited on a surface of the flexible display device by an atomic layer deposition method.

As shown in FIG. 8, the block S12 may comprise:

S121: a second inorganic layer may be deposited on a surface of the first inorganic layer by the atomic layer deposition method.

As shown in FIG. 8, the block S13 may comprise:

S131: an organic layer may be deposited on a surface of the second inorganic layer by a chemical vapor deposition method.

As shown in FIG. 7, after the block S13, the flow chart may further comprise:

S14: a packaging unit may be formed, which may have the first inorganic layer, the second inorganic layer arranged on the first inorganic layer, and the organic layer arranged on the second inorganic layer that are sequentially stacked; at least two of the packaging units may be arranged to be stacked on the flexible display device.

Thicknesses, materials, numbers of layers, and the like of parameters of the first inorganic layer, the second inorganic layer, and the organic layer may refer to the package assembly described in the above-mentioned embodiments of the present disclosure, therefore no additional description is given herebelow.

In the present disclosure, a flexible display device may be provided; a first inorganic layer may be deposited on a surface of the flexible display device; a second inorganic layer may be deposited on a surface of the first inorganic layer; an organic layer may be deposited on a surface of the second inorganic layer. Because the materials of the two layers may be different, so that the defect size (i.e., the sizes of the holes) inside the layers may be reduced, and the density of the layers may be increased. The effect of blocking the water vapor may be higher than that of a single layer, and the packaging effect may be better.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. A display device comprising: a flexible display device and a package assembly;
   the package assembly being attached to a surface of the flexible display device;
   wherein the package assembly comprises at least one packaging unit; the at least one packaging unit comprises a first inorganic layer, a second inorganic layer arranged on the first inorganic layer, and an organic layer arranged on the second inorganic layer that are sequentially stacked;
   wherein a material of the first inorganic layer and a material of the second inorganic layer are different, a thickness of at least one of the first inorganic layer and the second inorganic layer is in a range of about 10 to 100 nanometers, and a thickness of the organic layer is in a range of about 100 to 1000 nanometers.

2. The display device according to claim 1, wherein both the first inorganic layer and the second inorganic layer are layers formed by an atomic layer deposition method.

3. The display device according to claim 1, wherein the organic layer is a layer formed by a chemical vapor deposition method.

4. The display device according to claim 3, wherein a material of the organic layer is an organic material containing silicon oxycarbide.

5. The display device according to claim 1, wherein the material of the first inorganic layer is selected from the group consisting of a metal oxide and a combination of metal oxides; and the material of the second inorganic layer is selected from the group consisting of a metal oxide and a combination of metal oxides, which are different from the material of the first inorganic layer.

6. The display device according to claim 5, wherein the metal oxide comprises at least one of alumina, hafnium dioxide, zirconium dioxide, and tantalum pentoxide.

7. The display device according to claim 1, wherein a material of the organic layer is an organic material comprising at least one of silicon oxycarbide (SiOC), silicon oxycarbonitride (SiOCN), and SiOCH.

* * * * *